United States Patent
Wieczorek et al.

(10) Patent No.: US 7,494,872 B2
(45) Date of Patent: Feb. 24, 2009

(54) FIELD EFFECT TRANSISTOR HAVING A DOPED GATE ELECTRODE WITH REDUCED GATE DEPLETION AND METHOD OF FORMING THE TRANSISTOR

(75) Inventors: Karsten Wieczorek, Dresden (DE); Thomas Feudel, Radebeul (DE); Thorsten Kammler, Ottendorf-Okrilla (DE); Wolfgang Buchholtz, Radebeul (DE)

(73) Assignee: Advanced Micro Devices, Inc., Austin, TX (US)

( * ) Notice: Subject to any disclaimer, the term of this patent is extended or adjusted under 35 U.S.C. 154(b) by 1081 days.

(21) Appl. No.: 10/790,852

(22) Filed: Mar. 2, 2004

(65) Prior Publication Data
US 2005/0023611 A1 Feb. 3, 2005

(30) Foreign Application Priority Data
Jul. 31, 2003 (DE) ................. 103 35 103

(51) Int. Cl.
*H01L 29/72* (2006.01)
(52) U.S. Cl. ............... 438/259; 438/270; 438/291; 438/589; 257/330; 257/332
(58) Field of Classification Search .......... 257/330, 257/332; 438/259, 270, 271, 589, 291
See application file for complete search history.

(56) References Cited
U.S. PATENT DOCUMENTS

| 4,835,585 A | 5/1989 | Panousis ............. 357/23.4 |
|---|---|---|
| 5,576,227 A | 11/1996 | Hsu ........................ 437/35 |
| 5,888,880 A * | 3/1999 | Gardner et al. ........... 438/424 |
| 5,962,894 A * | 10/1999 | Gardner et al. ........... 257/330 |
| 5,994,736 A | 11/1999 | Sugawara et al. ......... 257/330 |
| 6,200,866 B1 | 3/2001 | Ma et al. .................. 438/299 |
| 6,252,277 B1 | 6/2001 | Chan et al. ................ 257/330 |
| 6,258,677 B1 | 7/2001 | Ang et al. ................. 438/300 |
| 6,284,609 B1 | 9/2001 | Ang et al. ................. 438/300 |
| 6,355,955 B1 * | 3/2002 | Gardner et al. ........... 257/330 |
| 6,399,450 B1 | 6/2002 | Yu .......................... 438/300 |
| 6,551,886 B1 | 4/2003 | Yu .......................... 438/300 |
| 6,664,592 B2 * | 12/2003 | Inumiya et al. ............ 257/330 |
| 6,674,124 B2 * | 1/2004 | Hshieh et al. ............. 257/330 |
| 2002/0001891 A1 | 1/2002 | Kim et al. ................ 438/197 |

FOREIGN PATENT DOCUMENTS

FR 2 827 705 7/2001

* cited by examiner

*Primary Examiner*—Eugene Lee
(74) *Attorney, Agent, or Firm*—Williams, Morgan & Amerson, P.C.

(57) ABSTRACT

By forming an implantation mask prior to the definition of the drain and the source areas, an effective decoupling of the gate dopant concentration from that of the drain and source concentrations is achieved. Moreover, after removal of the implantation mask, the lateral dimension of the gate electrode may be defined by well-established sidewall spacer techniques, thereby providing a scaling advantage with respect to conventional approaches based on photolithography and anisotropic etching.

27 Claims, 6 Drawing Sheets

FIELD EFFECT TRANSISTOR HAVING A DOPED GATE ELECTRODE WITH REDUCED GATE DEPLETION AND METHOD OF FORMING THE TRANSISTOR

BACKGROUND OF THE INVENTION

1. Field of the Invention

The present invention generally relates to the fabrication of integrated circuits, and, more particularly, to the manufacture of field effect transistors having a doped gate electrode, such as a doped polysilicon gate electrode, wherein a dopant concentration is controllable independently from a dopant concentration in the drain and source regions.

2. Description of the Related Art

The fabrication of integrated circuits requires the formation of a huge number of circuit elements on a given chip area according to a specified circuit layout. Generally, a plurality of process technologies are currently practiced, wherein, for logic circuitry, such as microprocessors, storage chips and the like, CMOS technology is currently the most promising approach due to the superior characteristics in view of operational speed and/or power consumption. In this technology, millions of complementary transistors, i.e., N-channel transistors and P-channel transistors, are formed on an appropriate substrate, wherein the ongoing demand for improved transistor performance has now rendered so-called SOI devices a preferred circuit architecture for highly advanced CMOS devices. SOI devices are manufactured in and on a relatively thin semiconductor layer, typically silicon (silicon on oxide), which in turn is formed on an insulating layer. By means of corresponding isolation structures completely enclosing a circuit element, complete electrical insulation from other circuit elements is achieved, thereby providing a plurality of advantages that may not readily be accomplished by conventional CMOS devices manufactured on bulk semiconductor substrates. Irrespective of the circuit architecture used, a typical MOS transistor comprises PN junction regions that are separated from each other by a channel region, which is controlled by a gate electrode formed above the channel region and separated therefrom by a thin insulating layer. The dimension of the channel region corresponding to the distance between the two PN junction regions, which are also referred to as drain regions and source regions, is denoted as channel length and represents the dominant design characteristic of the MOS transistor. By reducing the channel length of the transistor, not only the transistor size but also the functional behavior thereof may be specifically designed so as to obtain a desired transistor performance. Presently, a gate length of approximately 0.1 µm and significantly less may be encountered in advanced CMOS devices with corresponding clock frequencies of 2000 MHz and more. Although the continuous size reduction of transistor elements has provided significant advantages in view of performance and/or power consumption, a plurality of issues has to be addressed so as to not unduly offset some of the advantages that are offered by the reduced dimensions of the circuit elements. Especially, the fabrication of the circuit components having the critical dimensions, such as the gate electrode of the transistor element substantially determining the channel length, requires huge efforts so as to reliably and reproducibly form these tiny circuit components. For instance, it is an extremely complex process to form gate electrodes having a gate length that is well below the wavelength of the UV radiation used to transfer a layout image from a reticle to a resist layer formed on the substrate.

A further difficulty arises from the fact that the PN junctions are defined by dopant profiles that are, at least partially, created by ion implantation and subsequent anneal cycles. Since, typically, reduced feature sizes require higher dopant concentrations to compensate for the reduced conductivity owing to reduced cross-sectional areas, complex implantation cycles are required, wherein the vertical and lateral dopant profile has to be precisely controlled so as to achieve the desired transistor performance. Since the dopants implanted are subjected to diffusion upon elevated temperatures of the device during the manufacturing processes, very strict requirements have to be met with respect to a thermal budget that describes the diffusivity of the dopants over time. For instance, advanced transistor elements require extreme high doping levels in the drain and source regions, which are in conventional process technologies also supplied to the gate electrode acting as an implantation mask during the implant cycles, wherein, particularly for P-channel transistors that may be doped with boron, a severe boron diffusion into the gate insulation layer may take place, thereby causing severe reliability constraints for the device.

Other problems result from the fact that a reduced transistor gate length also requires extremely shallow PN junctions in order to maintain the required controllability of the channel conductivity. For SOI devices, therefore, the thickness of the silicon layer has to be correspondingly reduced, which, in turn, may result in an increased contact resistance to the drain and source regions owing to a reduced surface area connecting the highly doped semiconductor regions with a metal silicide region formed in drain and source areas.

With reference to FIGS. 1a-1d, a typical conventional process flow for forming an advanced SOI MOS transistor will now be described to discuss some of the problems involved in extreme device scaling in more detail. In FIG. 1a, a transistor 100 comprises a substrate 101 having formed thereon an insulating layer 102, which is frequently referred to as buried oxide, and a crystalline silicon layer 104. A thickness of the silicon layer 104 is selected in conformity with the overall device dimensions and is especially adapted to the length of a gate electrode 105, which is formed above the silicon layer 104 and is separated therefrom by a gate insulation layer 106. The gate electrode 105 is typically comprised of polysilicon and the gate insulation layer 106 may be comprised of silicon dioxide, silicon oxynitride, and the like. An isolation structure 103 substantially defines the dimensions of the transistor 100 and electrically insulates the transistor 100 from neighboring circuit elements. Sidewall spacers 107 are formed on the sidewalls of the gate electrode 105, and drain and source regions 108, having a specified lateral dopant profile, are formed within the silicon layer 104.

A typical process flow for forming the transistor 100 as depicted in FIG. 1a may include the following processes. The substrate 101 including the insulating layer 102 and the silicon layer 104 may be obtained from a corresponding substrate manufacturer with the required thickness of the silicon layer 104, or the thickness may be adapted by correspondingly polishing the substrate 101. In other cases, the substrate 101 including the layers 102 and 104 may be manufactured by well-known wafer-bond techniques. Thereafter, the isolation structure 103 is formed using well-established photolithography, etch, deposition and polishing techniques that are well known in the art. Thereafter, a thin dielectric layer having the required characteristics for the gate insulation layer 106 may be formed by, for instance, advanced oxidation and/or deposition processes. A polysilicon layer is then formed on the thin dielectric layer and this layer stack is then patterned by advanced photolithography and subsequent anisotropic etch processes to obtain the gate electrode 105 and the gate insulation layer 106 having the required gate length, i.e., the horizontal extension in FIG. 1a. Next, a first ion implantation sequence may be carried out so as to form extensions of the dopant profile for the drain and source regions 108, wherein the polysilicon gate electrode 105 acts as an implantation mask. Thereafter, the sidewall spacers 107 may be formed, depending on the process regime two or more spacers may be formed sequentially, and further ion implantation cycles are carried out so as to introduce the finally required dopant concentration into the drain and source regions 108. Again, the same dopant dose is also provided to the gate electrode 105. Thereafter, anneal cycles are performed so as to activate dopants and to re-crystallize, at least partially, those portions of the drain and source regions 108 that are damaged by the previous implantation sequences. For manufacturing P-channel transistors, boron is frequently used as the dopant for forming the drain and source regions 108, which exhibits a high diffusivity. Therefore, boron penetration into the gate insulation layer 106 during the implantation and the subsequent anneal cycles may take place and may reduce the reliability of the gate insulation layer 106, i.e., the long term resistance against electrical breakdown, may significantly drop. For extremely high boron doses, even the dopant concentration of the channel region formed between the drain and source regions 108 may be negatively influenced.

FIG. 1b schematically shows the transistor 100 according to one conventional approach that results in further issues with respect to device scaling. In FIG. 1b, a metal silicide region 109 is formed in the gate electrode 105 and corresponding metal silicide regions 110 are formed in the drain and source regions 108. The metal silicide regions 109 and 110 may be comprised of, for instance, cobalt silicide, which exhibits a significantly lower resistivity than silicon even when doped with the extremely high concentrations of advanced MOS transistors. Hence, it would be desirable for the metal silicide region 109 to occupy as much space as possible in the gate electrode 105 so as to efficiently reduce the resistivity thereof. The metal silicide regions 109 and 110 are formed in a common silicidation process, for instance involving the deposition of a refractory metal layer, a first anneal cycle so as to form cobalt monosilicide, a selective removal of non-reacted cobalt and a second anneal cycle so as to convert cobalt monosilicide into a low-ohmic cobalt disilicide. The demand for a large thickness of the metal silicide region 109 results in a complete consumption of the vertical extension of the drain and source regions 108, which, on the other hand, leads to an increased contact resistance to the drain and source regions 108 as the current flowing through the drain and source regions 108 may now enter the silicide region 110 through the lateral interface only, since the horizontal bottom interface of the metal silicide region 110 is no longer available for the charge carrier transport. As a consequence, frequently, an alternative approach will be employed, as is explained with reference to FIG. 1c.

FIG. 1c schematically shows the transistor 100 prior to the formation of metal silicide regions. In FIG. 1c, silicon regions 111 are formed on the drain and source regions 108 and on the gate electrode 105 by selective epitaxial growth. Typically, the silicon regions 111 may then be grown after a first implantation for forming extensions of the drain and the source regions 108. Depending on the process requirements, the silicon regions 111 may be grown prior to or after the final implantation cycle for forming the drain and source regions 108.

FIG. 1d schematically shows the transistor 100 after the formation of the silicide regions 109 and 110 in the enlarged gate electrode 105 and the drain and source regions 108. As is shown, the silicidation process may now be controlled in such a manner that the metal silicide region 110 reaches into the drain and source regions 108 but, nevertheless, does not completely consume the silicon, thereby providing an increased interface for charge carrier transport to the channel region. Although this conventional transistor architecture may avoid some of the problems as discussed with reference to FIG. 1b, the ongoing device scaling may nevertheless bring about limitations of the physical gate length caused by conventional photolithography as the lithography and the subsequent anisotropic etch process substantially determine the gate length and, thus, the potentiality for transistor scaling. Moreover, as pointed out with reference to FIG. 1a, the dopant concentration in the gate electrode 105 is directly coupled with the dopant concentration provided in the source and drain regions 108, wherein this dopant concentration may be tailored to create a minimal contact and sheet resistance in these regions. However, especially for the highly diffusive boron of P-channel transistors, the gate dopant concentration must be thoroughly controlled to minimize dopant penetration of the gate insulation layer 106 and of the underlying channel region, leading to a conflict in selecting the implant parameters used to generate the drain/source dopant profiles.

In view of the problems identified, there still exists a need for an improved technique that enables the further scaling of the gate length substantially without compromising transistor performance, especially the performance of P-channel transistors.

SUMMARY OF THE INVENTION

Generally, the present invention is directed to a technique that enables the decoupling of the gate dopant concentration and the drain and source dopant concentrations, while providing the potential for reducing the gate length beyond the limits given by presently available lithography techniques.

According to one illustrative embodiment of the present invention, a method for forming a field effect transistor comprises the formation of an implantation mask over a crystalline semiconductor region and the formation of a drain region and a source region using the implantation mask, wherein the drain and source regions each has a top surface located above a surface of the crystalline semiconductor region. The implantation mask is then removed to expose a surface area of the crystalline semiconductor region and a gate insulation layer is formed on the exposed surface area. Furthermore, a gate electrode is formed on the gate insulation layer and the gate electrode is then doped.

According to still another illustrative embodiment of the present invention, a field effect transistor comprises a substrate having formed thereon a semiconductor region. A drain region extends along a lateral direction and a height direction, and a source region is provided that extends along the lateral direction and the height direction. Moreover, a gate electrode is provided and extends along the lateral direction and the height direction, wherein the gate electrode is laterally located between the drain region and the source region and is separated from the semiconductor region by a gate insulation layer, wherein the drain and source regions extend along the height direction at least to an upper surface of the gate electrode.

BRIEF DESCRIPTION OF THE DRAWINGS

The invention may be understood by reference to the following description taken in conjunction with the accompanying drawings, in which like reference numerals identify like elements, and in which.

Figure 1A:
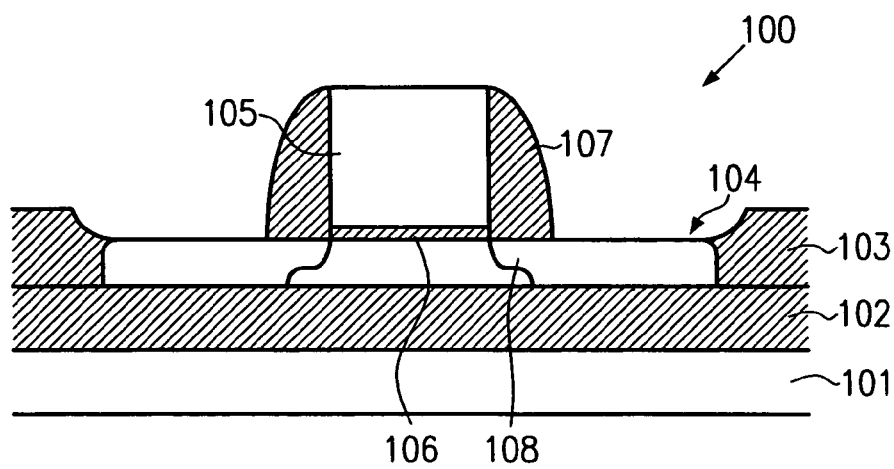
FIGS. 1a-1d schematically show cross-sectional views of an SOI transistor element according to alternative conventional approaches.
Figure 1B:
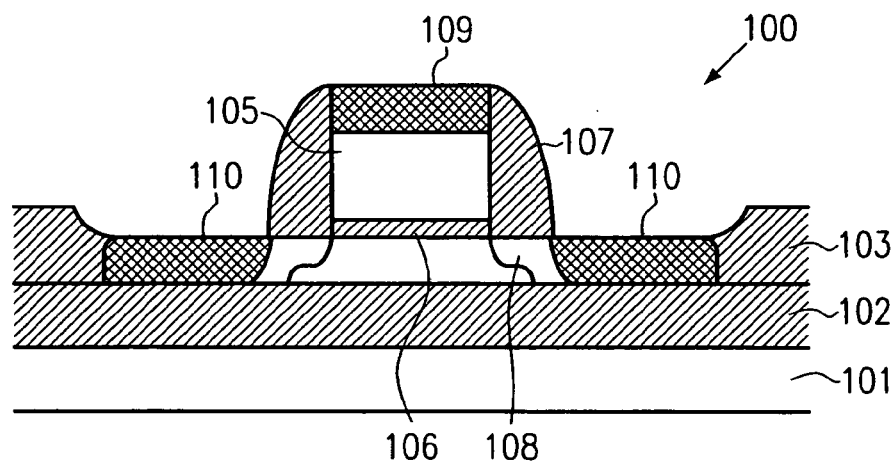
Figure 1C:
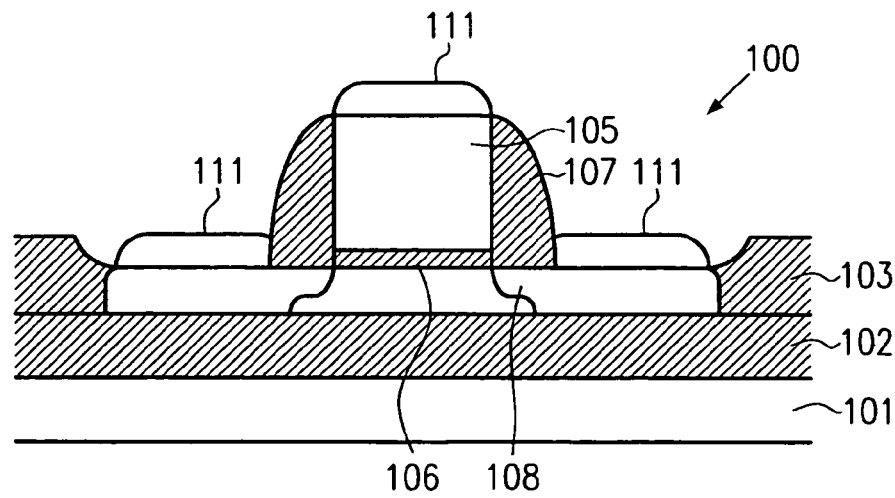
Figure 1D:
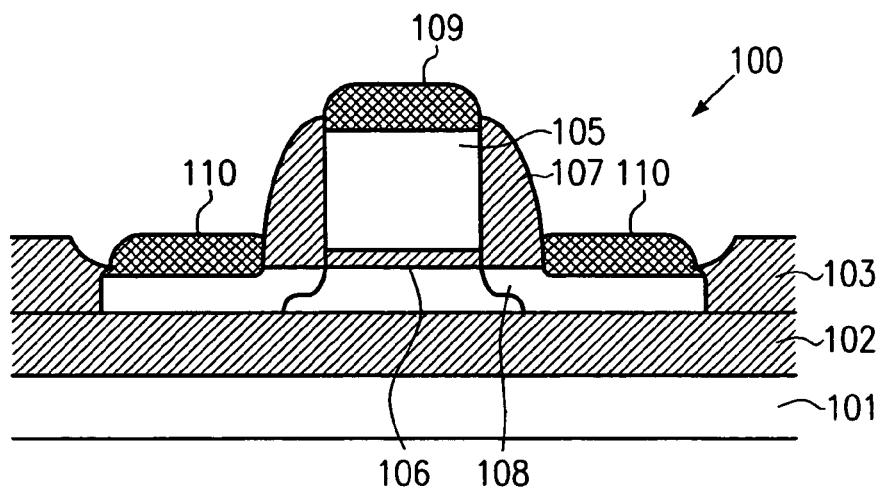

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

In the following detailed description of further illustrative embodiments of the present invention, a transistor element formed on an SOI substrate is referred to, since this circuit architecture is presently considered the most promising candidate for manufacturing advanced CMOS devices. It should be appreciated, however, that the principles of the present invention may readily be applied to transistor devices formed on bulk semiconductor substrates, such as silicon substrates, or any other appropriate III-V or II-VI semiconductors. Consequently, the present invention should not be considered as being restricted to silicon-based SOI devices unless such restrictions are explicitly set forth in the appended claims.

Figure 2A:
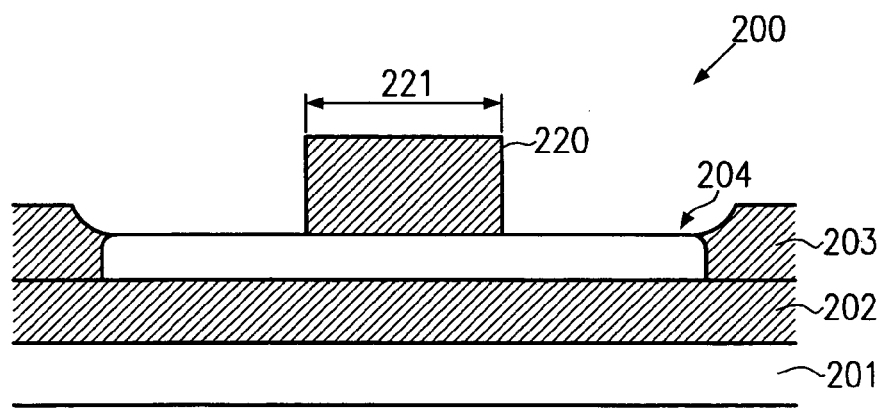
FIGS. 2a-2i schematically show a transistor device during various manufacturing stages in accordance with illustrative embodiments of the present invention.

With reference to FIGS. 2a-2i, further illustrative embodiments will now be described in more detail. In FIG. 2a, a transistor 200 comprises a substrate 201, for instance in the form of a silicon substrate or any other substrate, such as glass, sapphire, and the like, wherein an insulating layer 202 and a substantially crystalline semiconductor layer 204 are formed on the substrate 201. The semiconductor layer 204 may be comprised of silicon, silicon/germanium, or any other appropriate semiconductor material. A thickness of the semiconductor layer 204, which will be considered in the following illustrative example as being comprised of silicon, is selected so as to conform with the requirements of an extremely scaled SOI transistor element. The overall dimensions of the transistor 200 are defined by an isolation structure 203 comprised of an insulating material, such as silicon dioxide and/or silicon nitride. An implantation mask 220 having a lateral dimension 221 is formed above the semiconductor layer 204. The implantation mask 220 resembles with its shape outlines of a gate electrode to be formed. The implantation mask 220 may be comprised of any appropriate material, such as silicon dioxide, silicon nitride and the like for which selective etch recipes are available or may be established so as to conveniently remove the implantation mask 220 selectively to the semiconductor layer 204 in an advanced manufacturing stage as will be described later on. In one particular embodiment, the lateral dimension 221 of the implantation mask 220 may be selected so as to exceed the lateral extension of the gate electrode to be formed, i.e., the design gate length, so that the implantation mask 220 may readily be formed by well-established lithography and anisotropic etch techniques, while providing the potentiality to significantly reduce the actual dimensions of the gate electrode without being restricted by the resolution of currently available photolithography techniques. In other embodiments, when the critical transistor dimensions, i.e., the gate length, are well within the resolution of presently available lithography techniques, the lateral dimension 221 of the implantation mask 220 may substantially represent the gate length of the gate electrode still to be formed.

A typical process flow for forming the device 200, as shown in FIG. 2a, may comprise the following process. After providing the substrate 201 or forming the same by means of advanced wafer-bond techniques, the isolation structure 203 may be formed by well-established lithography, anisotropic etch, deposition and polish techniques. Thereafter, possible implantation sequences may be performed so as to establish a required vertical dopant profile (not shown) for the transistor operation within the semiconductor layer 204. Thereafter, a layer of appropriate dielectric material is deposited, for instance by plasma enhanced chemical vapor deposition, with an appropriate thickness that provides the required ion blocking effect in a subsequent implantation sequence. If, for instance, silicon nitride is the main component of the dielectric layer, a thin silicon dioxide layer may be deposited prior to the silicon nitride so as to act as an etch stop layer during the patterning of the dielectric layer. As noted before, patterning of the dielectric layer so as to form the implantation mask 220 may be accomplished by well-established lithography and anisotropic etch techniques, since, in one illustrative embodiment, the lateral dimension 221 and the size in the transistor width dimension may exceed the corresponding gate dimensions, when extremely scaled transistor elements are considered.

Figure 2B:
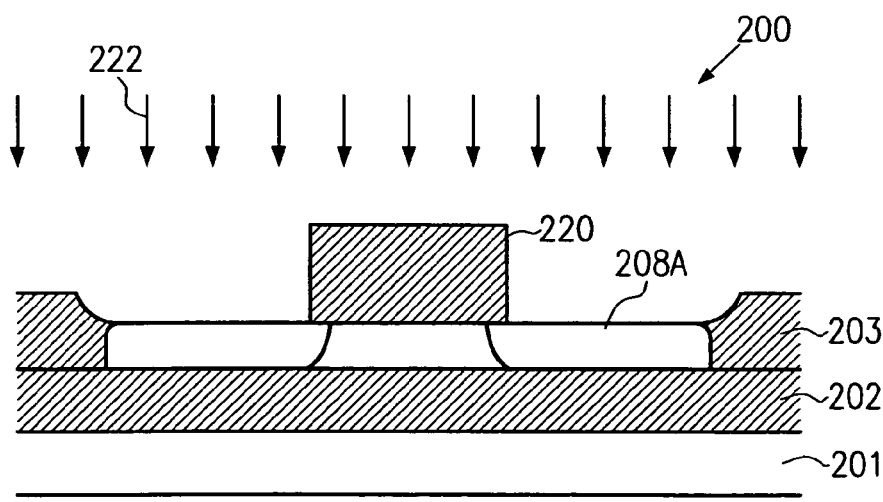

FIG. 2b schematically shows the device 200 after completion of the anisotropic etch process for patterning the implantation mask 220 wherein the device 200 is subjected to an implantation sequence, denoted as 222, so as to form a high dopant concentration that is laterally defined, i.e., self-aligned, by the implantation mask 220. The dopant concentration formed in the semiconductor layer 204 may represent the required concentration for extension regions 208a for corresponding source and drain regions still to be formed. The implantation sequence 222 may include a plurality of implantation steps as is required for achieving the required dopant profile 208a, wherein, depending on the lateral dimension 221 of the implantation mask 220, tilted implant steps may be involved so as to obtain a dopant profile as implanted that extends under the implantation mask 220 if required. In one embodiment, a heat treatment by means of a rapid thermal anneal cycle is then performed so as to re-crystallize any amorphized semiconductor areas, which may have been damaged during the previous implantation sequence 222. Contrary to the conventional approach, the parameters for the anneal cycle may be selected so as to substantially completely re-crystallize the semiconductor layer 204, wherein the temperature induced dopant diffusion may advantageously be taken into consideration so as to produce a desired lateral enlargement of the dopant profile 208a. Consequently, the lateral dimension 221 of the implantation mask 220 as well as the preceding implantation sequence 222 may be designed such that, in combination with the elevated temperatures and duration of the present anneal cycle and of subsequent anneal cycles, the desired lateral dopant profile 208a and, thus, the required channel length, is obtained. A corresponding behavior of dopants during implantation and annealing may be calculated by corresponding simulation programs, the results of which may then enable the establishment of appropriate design values for the lateral extension 221 and for the process parameters of the implantation sequence 222 and the anneal cycle for re-crystallizing amorphized semiconductor areas.

Figure 2C:
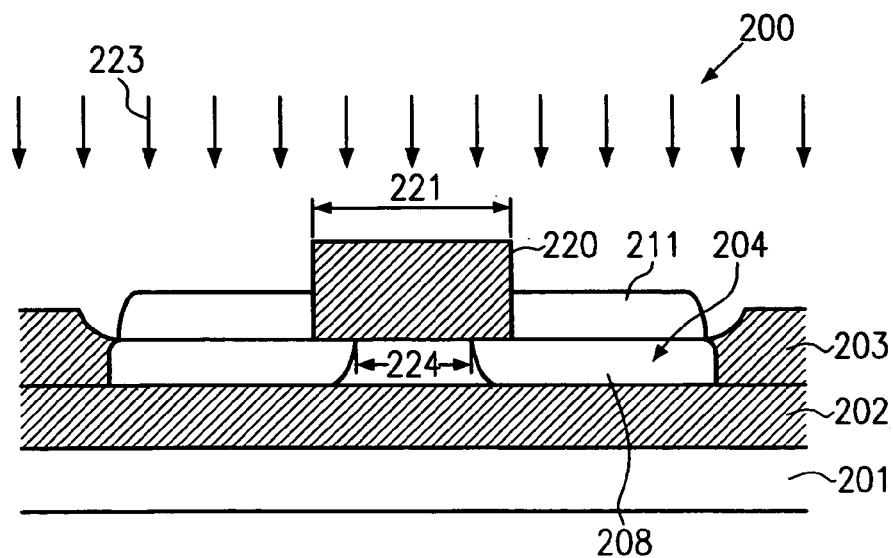

FIG. 2c schematically shows the transistor 200 in a further advanced manufacturing stage. The transistor 200 comprises epitaxially grown semiconductor regions 211 formed on the semiconductor layer 204. A thickness or a height of the semiconductor region 211 is selected in conformity with device requirements, as the height of the semiconductor regions 211 substantially determines the height of a gate electrode to be formed. For instance, a height of the semiconductor region 211 may range from approximately 20-100 nm.

The epitaxial growth of semiconductor material on an underlying semiconductor layer, for instance the growth of silicon on a silicon layer, is a well-established process and, therefore, a description thereof will be omitted. Since all other portions of the transistor 200 are covered by dielectric material, the growth of the regions 211 is restricted to the exposed silicon areas. Thereafter, the transistor 200 is subjected to a further ion implantation process 223 so as to create the finally desired dopant concentration in the drain and source regions 208. In other embodiments, the previously performed implantation sequence 222 and the corresponding anneal cycles may be omitted and may be integrated into the implantation cycle 223, thereby substantially avoiding low energy implantation sequences due to the increased thickness of the semiconductor area into which dopants are to be introduced. Thereafter, an anneal sequence is carried out, wherein implantation induced damage is substantially cured and the dopants are activated. Thereby, the diffusion of the dopants during the anneal cycle, possibly in combination with the already obtained dopant migration during the previously performed anneal cycles, then creates the finally required lateral dopant profile and, thus, creates the channel length 224. It should be emphasized that, contrary to the conventional approach, the anneal parameters may, in combination with the implantation parameters and the lateral dimension 221 of the implantation mask 220, be selected so as to only provide for optimum characteristics of the drain and source regions 208 without risking any negative influence on other transistor components, such as enhanced dopant diffusion in a gate electrode and a gate insulation layer as in the conventional case.

Figure 2D:
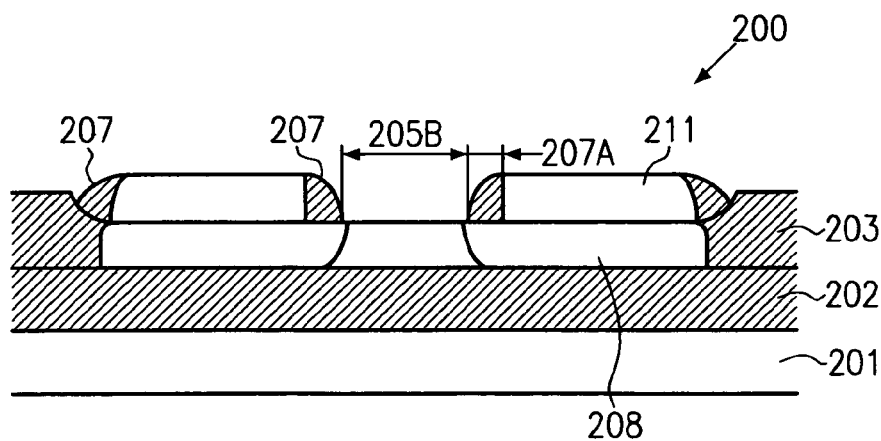

FIG. 2d schematically shows the transistor 200 with the implantation mask 220 removed and with sidewall spacers 207 formed on inner and outer sidewalls of the semiconductor regions 211. The sidewall spacers 207 may be comprised of any appropriate material, such as silicon dioxide, silicon nitride, and the like. The implantation mask 220 may be selectively removed by an isotropic etch process, for instance by isotropic dry etch or isotropic wet etch processes, which exhibit a high selectivity to the surrounding semiconductor material without causing undue damage.

In some embodiments, when the implantation mask 220 does not exhibit a significant etch selectivity with respect to the isolation structure 223, a further photolithography step may be performed with, for instance, the same lithography reticle (not shown) as used for the patterning of the implantation mask 220 so as to form a resist mask exposing the implantation mask 220. Thereafter, with or without a resist mask, the implantation mask 220 is then removed by a corresponding isotropic etch process. After removal of the implantation mask 220 and possibly of the resist mask, the sidewall spacers 207 are formed by depositing one or more material layers with a specified thickness and subsequently anisotropically etching excess material of the one or more layers. Corresponding sidewall spacer techniques are well established and a detailed description thereof may be omitted. It should be appreciated, however, that a width 207a of the sidewall spacer 207 is well controllable and may, therefore, define the finally obtained gate length, since the lateral extension 221 of the implantation mask 220 (see FIG. 2c) is reduced by two times of the spacer width 207a, thereby defining a gate length 205b. Consequently, with respect to the conventional approach, a scaling advantage of two times the spacer width 207a is obtained, when the implantation mask 220 is formed by presently cutting-edge photolithography.

Figure 2E:
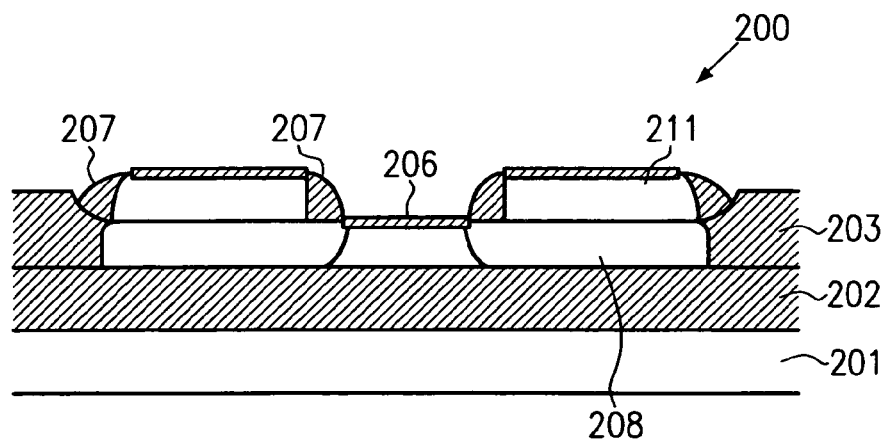

FIG. 2e schematically shows the device 200 in a further advanced manufacturing stage, wherein a gate insulation layer 206 is formed between the sidewall spacers 207. In the embodiment shown, the gate insulation layer 206 is formed by advanced oxidation techniques so that a portion of the semiconductor in the layer 204 and, of course, on top of the regions 211 may be consumed to form an oxide layer of a required thickness. In other embodiments, the gate insulation layer 206 may be formed by advanced deposition techniques as are well known in the art.

Figure 2F:
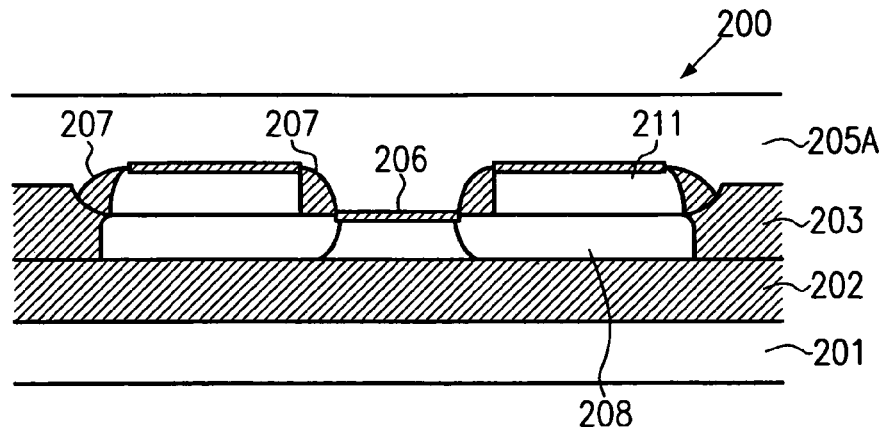

FIG. 2f schematically shows the transistor 200 with a layer of gate electrode material 205a formed thereon. The layer 205a may be comprised of, for instance, polysilicon when a silicon-based transistor is considered. The polysilicon layer 205a may be deposited by well-established chemical vapor deposition techniques, wherein a thickness of the layer 205a is selected such that a space between the regions 211 is reliably filled with the gate electrode material. Thereafter, excess material of the layer 205a may be removed by chemical mechanical polishing (CMP) and/or by etching the layer 205a. If a substantial portion of the layer 205a is removed by etching, it may be advantageous to planarize the topography of the layer 205a by chemical mechanical polishing prior to starting the etch process. In one embodiment, the excess material is removed by CMP, wherein the polishing process is monitored so as to indicate the exposure of the gate insulation layer 206 on top of the semiconductor regions 211. Thereafter, the polishing process may be continued so as to reliably remove the thin gate insulation layer 206 on top of the semiconductor regions 211, thereby also flattening an upper portion of the sidewall spacers 207.

Figure 2G:
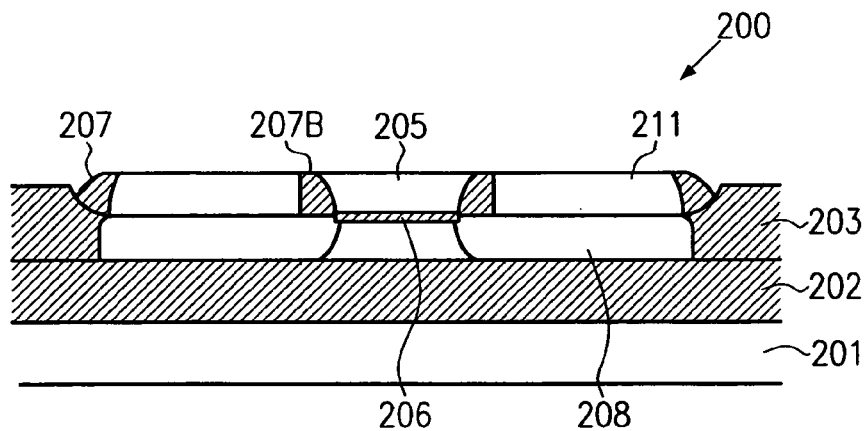

FIG. 2g schematically shows the transistor 200, after removal of excess material of the layer 205a by CMP, thereby forming a gate electrode 205. Note that flattened surface portions 207b of the sidewall spacer 207 provide a reliable electrical insulation of the gate electrode 205 from the semiconductor regions 211. In other embodiments, when the majority of the excess material of the layer 205a is removed by etching, the etch process may be stopped upon clearance of the gate insulation layer 206 on top of the semiconductor regions 211 (see FIG. 2f) and subsequently, a selective etch process may be performed so as to remove the exposed gate insulation layer 206. If it is deemed appropriate, a further etch of the semiconductor material may be performed so as to reduce the height of the semiconductor regions 211 and of the gate electrode 205, thereby providing a reliable electrical insulation between these regions by means of the sidewall spacers 207, since the height of the gate electrode 205 and of the regions 211 is now lowered well below the top side of the sidewall spacers 207.

Figure 2H:
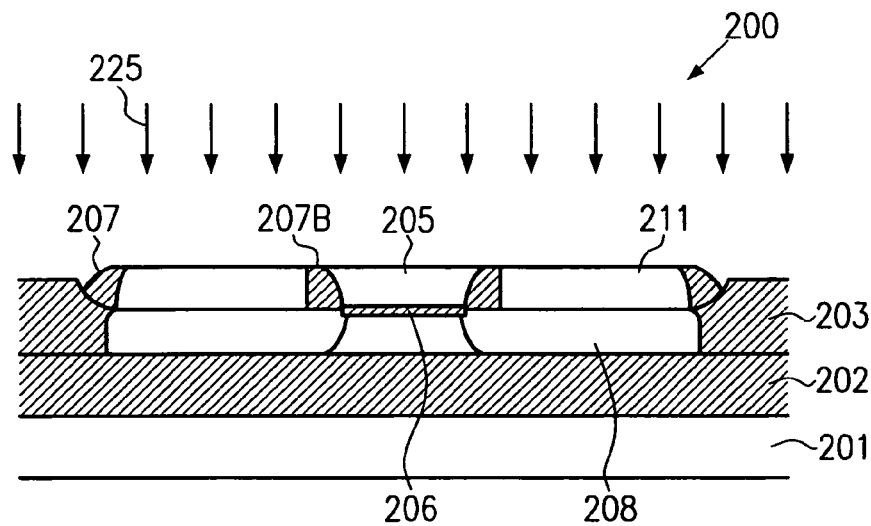

FIG. 2h schematically shows the transistor 200 when subjected to a further ion implantation sequence 225, which is designed to increase the conductivity of the gate electrode 205 while at the same time substantially avoid any detrimental side effects as are known in the conventional approach. That is, the implantation parameters during the ion implantation sequence 225 may be selected such that dopant penetration into the gate insulation layer 206 is maintained as low as possible while at the same time a dopant concentration in the vicinity of the gate insulation layer 206 is increased so as to minimize the gate depletion. Since the ion implantation sequence 225 is tailored to obtain superior gate characteristics instead of obtaining superior drain/source characteristics or compromised characteristics for both the gate and the drain/source as in the conventional approach, an overall enhanced transistor performance is achieved.

In other embodiments, a further resist mask may be formed (not shown) using, for instance, the same lithography reticle as for the formation of the implantation mask 220, so that a high degree of flexibility in choosing appropriate dopants for the implantation sequence 225 is obtained. For instance, if the transistor device 200 represents a P-channel transistor, the dopant concentration in the drain and source regions 208 may have been formed by boron which exhibits a high diffusivity during implantation. It may, therefore, be more appropriate, in some cases, to use other dopants, possibly of an opposite conductivity type compared to boron, for the gate implantation 225. Since other dopants, especially of an opposite conductivity type, may unduly affect the dopant concentration in the regions 211, the additional resist mask may substantially block the ion penetration during the implantation sequence 225.

Thereafter, when the transistor 200 is a silicon-based transistor, a silicidation process may be performed similarly as in conventional devices so as to increase the conductivity of the regions 211 and of the gate electrode 205.

Figure 2I:
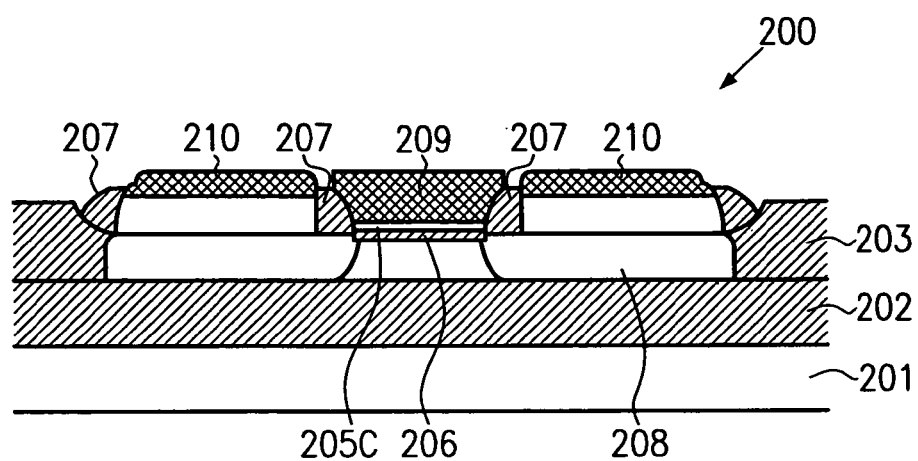

FIG. 2i schematically shows the transistor 200 after completion of the silicidation process, which is performed as a self-aligned reaction of the silicon with a refractory metal, such as cobalt, a subsequent removal of non-reacted metal and a further anneal cycle so as to further convert the cobalt monosilicide in a stable and highly conductive cobalt disilicide, thereby forming metal silicide regions 209 in the gate electrode 205 and corresponding metal silicide regions 210 in the drain and source regions 208.

As a result, the transistor 200, as shown in FIG. 2i, has a highly conductive gate electrode 205 including the metal silicide region 209 and a doped portion 205c, in which the dopant concentration is optimized so as to minimize gate depletion and substantially suppress dopant penetration of the gate insulation layer 206. On the other hand, required high dopant concentrations are established in the drain and source regions 208 including the semiconductor regions 211, wherein, at the same time, the increased interface of the metal silicide region 210 with the remaining drain and source region 208 provides efficient charge carrier transport from the metal silicide region 210 into the extension and channel regions of the transistor 200. In this way, extremely scaled SOI transistors may be fabricated having a channel region with a thickness in the range of approximately 5-50 nm without unduly compromising source and drain contact and sheet resistance. Moreover, the effective gate length and channel length are no longer restricted by the available resolution of presently existing cutting edge photolithography but may be reduced on the basis of well-established sidewall spacer techniques.

With reference to FIGS. 3a-3e, further illustrative embodiments will now be described, wherein the epitaxial growth process, as described in the previous embodiments, is not required. It should be noted that components similar to those shown in FIGS. 2a-2i are denoted by the same reference numbers except for the very first digit and a detailed description of these components and processes for the formation thereof may, therefore, be omitted.

Figure 3A:
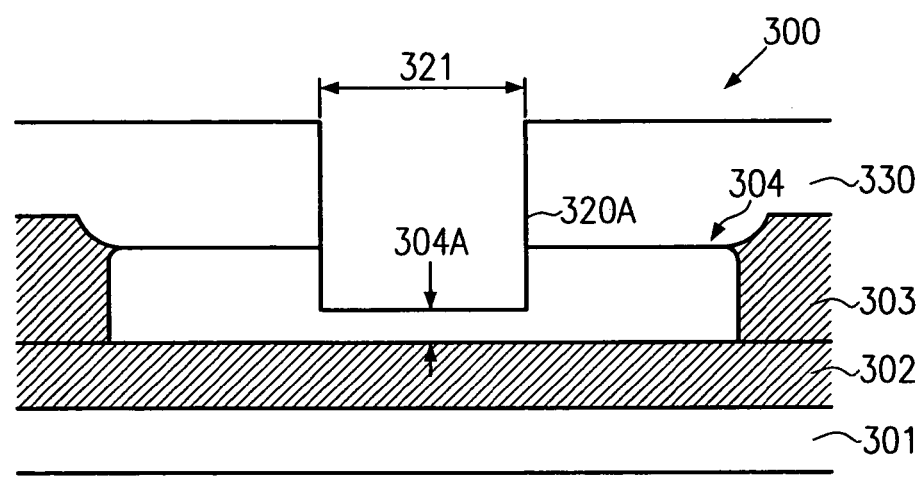
FIGS. 3a-3e schematically show a transistor element during various manufacturing stages in accordance with further illustrative embodiments in which an epitaxial growth is not required.

In FIG. 3a, a transistor 300 comprises a substrate 301 having formed thereon an insulating layer 302 and a semiconductor layer 304 that is enclosed by an isolation structure 303. A resist mask 330 is formed above the semiconductor layer 304 and exposes an opening 320a having a lateral dimension 321. The opening 320a is also formed partially within the semiconductor layer 304, wherein the opening 320a exposes a semiconductor region of the semiconductor layer 304 having a thickness 304a as is required for a channel region of the transistor 300.

The substrate 301, including the isolation structure 303, may be formed in a similar process as previously described with reference to FIG. 2a. The resist mask 330 is patterned by lithography, wherein substantially the same criteria apply with respect to the lateral dimension 321 as has been pointed out with reference to the implantation mask 220 in FIG. 2a. The opening 320a within the semiconductor layer 304 may be formed by an anisotropic etch process similarly as is performed during the formation of the isolation structure 303. Consequently, corresponding process techniques are well established in the art. It should be noted that an initial thickness of the semiconductor layer 304 is selected so as to represent the final height of the transistor element 300, wherein the anisotropic etch process is controlled so that it provides the required shallow thickness 304a as is demanded by the appropriate transistor performance. Since the etch rate of corresponding anisotropic etch processes may be established in advance in a very accurate manner, the etch process may be reliably stopped in conformity with a design value of the thickness 304a.

Figure 3B:
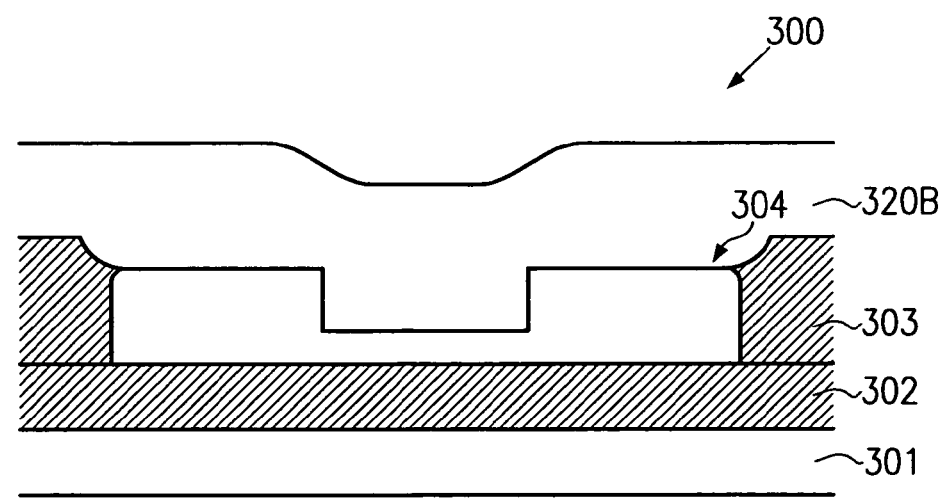

FIG. 3b schematically shows the transistor 300 with a dielectric layer 320b formed thereon, wherein a thickness of the layer 320b is selected so as to reliably fill the opening 320a within the semiconductor layer 304. The formation of the structure as shown on FIG. 3b may be accomplished by depositing the layer 320b with an appropriate material, such as silicon dioxide, silicon nitride, and the like, by means of CVD after removal of the resist mask 330.

Figure 3C:
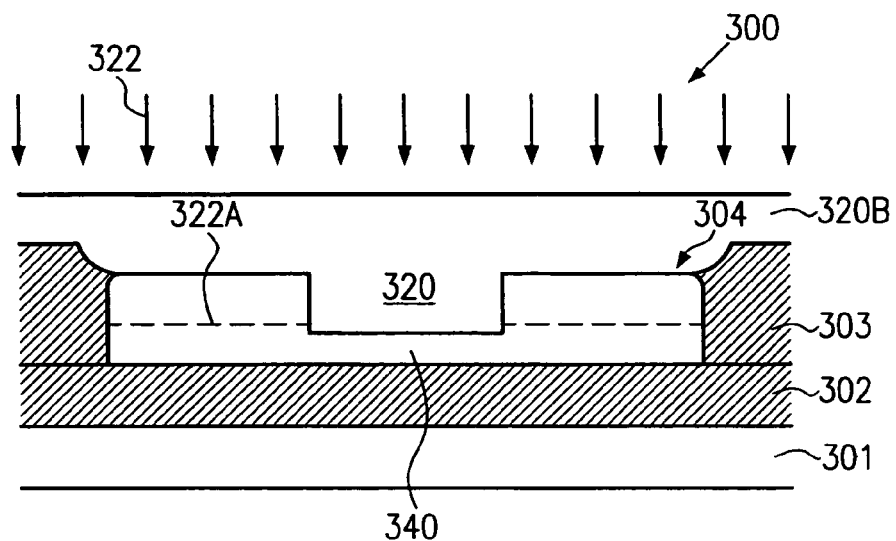

FIG. 3c schematically shows the device 300 after planarizing the topography of the layer 320b so as to form an implantation mask 320 within the opening 320a. The CMP process may be designed so as to leave a thin layer above the surface of the semiconductor layer 304, as is shown in FIG. 3c, or, in other embodiments, the CMP process may be continued so as to substantially completely remove any excess material from the semiconductor layer 304. Thereafter, an ion implantation process 322 is performed so as to deposit a required ion concentration at a specified depth 322a. Owing to the implantation mask 320 formed within the opening 320a, a channel region 340 may remain substantially unaffected by the implantation sequence 322. Thereafter, the implantation mask 320 may be removed by a selective etch process which may be designed as an isotropic dry or wet etch process. Corresponding selective etch recipes are well established in the art and, thus, a detailed description may be omitted here. Next, an anneal cycle is performed so as to re-crystallize any amorphized semiconductor regions and to activate and diffuse the dopants implanted by the preceding implantation sequence 322. The parameters of the anneal cycle are selected such that a required dopant migration into the channel region 340 is obtained, thereby defining a specified channel length. Regarding appropriate implantation and anneal parameters, as well as the lateral dimension 321 of the opening 320a, the same criteria apply as already pointed out with reference to FIGS. 2b and 2c.

Figure 3D:
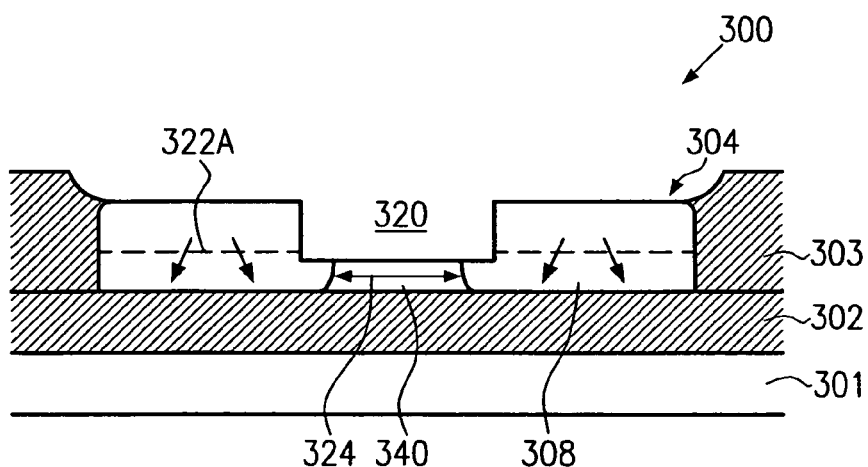

FIG. 3d schematically shows the transistor 300 after completion of the anneal cycle with correspondingly formed drain and source regions 308, defining a channel length 324 therebetween. Due to the removal of the implantation mask prior to the anneal process, diffusion into the channel region 340 from above-lying areas is substantially prevented.

Figure 3E:
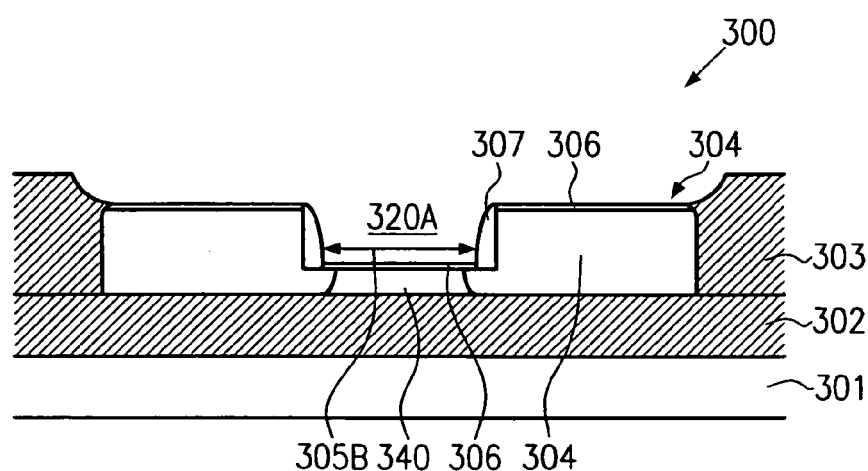

FIG. 3e schematically shows the transistor 300 with sidewall spacers 307 formed on the sidewalls of the opening 320a and a gate insulation layer 306 formed on the channel region 340 and the semiconductor layer 304. A width of the sidewall spacers 307 determines the finally obtained gate length 305b of a gate electrode to be formed within the opening 320a. A process sequence for forming the sidewall spacers 307 and the gate insulation layer 306 may substantially be the same as previously outlined with reference to FIGS. 2d and 2e.

The further processing, i.e., the formation of a gate electrode in the opening 320a including a specifically designed gate implantation cycle may be performed similarly as is already described with reference to FIGS. 2f-2i.

Consequently, a required thin channel region 340 may be provided without the necessity of a selective epitaxial growth step, thereby significantly reducing process complexity, wherein, nevertheless, a high degree of compatibility with the previously described embodiments is maintained. Due to the lack of an epitaxial growth step, throughput may be increased and production costs may be significantly reduced.

As a result, the present invention provides a technique that allows the formation of a transistor element, especially of SOI devices, having a gate length less than a corresponding gate length of currently available cutting edge devices, wherein the same well-established process techniques may be used. Furthermore, the effective decoupling of the dopant concentration in the gate electrode from that of the drain and source regions provides an enhanced channel contact and sheet resistance while, at the same time, improving the characteristics of the gate electrode. Thus, the present invention provides the potentiality for an aggressive scaling of transistor elements by using presently well-established manufacturing methods. As is obvious from the above-described embodiments, the principles of the present invention are not restricted to SOI devices, although the application thereon is highly advantageous, and may also be used in devices formed on bulk semiconductor substrates.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a field effect transistor, the method comprising:
   forming an implantation mask over a crystalline semiconductor region;
   forming a drain region and a source region adjacent said implantation mask, said drain and source regions each having a top surface located above a top surface of said crystalline semiconductor region;
   removing said implantation mask to expose a surface area of said top surface of said crystalline semiconductor region;
   forming a gate insulation layer on said exposed surface area of said top surface of said crystalline semiconductor region;
   forming a gate electrode on said gate insulation layer; and
   doping said gate electrode.

2. The method of claim 1, wherein forming said gate electrode includes depositing a gate electrode material above said gate insulation layer and removing excess material of said gate electrode material to form the gate electrode.

3. The method of claim 2, wherein said excess material is removed by chemical mechanical polishing.

4. The method of claim 2, wherein said excess material is removed by an etch process.

5. The method of claim 2, wherein said excess material is removed by chemical mechanical polishing and etching.

6. The method of claim 1, wherein a lateral size of said implantation mask is greater than a design value of a gate length of said gate electrode.

7. The method of claim 6, further comprising forming sidewall spacers on sidewalls of said drain and source regions that are exposed by removing said implantation mask.

8. The method of claim 7, wherein a width of said sidewall spacers is controlled on the basis of a target gate length for said gate electrode.

9. The method of claim 1, wherein forming said drain and source regions adjacent said implantation mask includes epitaxially growing a crystalline semiconductor layer adjacent to said implantation mask.

10. The method of claim 9, wherein a first implantation sequence for forming said drain and source regions is performed prior to epitaxially growing the semiconductor layer and a second implantation sequence for forming said drain and source regions is performed after epitaxially growing the semiconductor layer.

11. The method of claim 10, further comprising performing an anneal process to activate said dopants.

12. The method of claim 11, wherein said anneal process is controlled on the basis of a desired channel length defined by a lateral distance of the drain region and the source region.

13. The method of claim 12, wherein said anneal process includes a first anneal cycle performed after said first implantation sequence and prior to said second implantation sequence, said first anneal cycle being configured to substantially completely re-crystallize amorphized portions in said semiconductor region.

14. The method of claim 1, wherein said implantation mask is removed by an isotropic etch process.

15. The method of claim 1, further comprising forming metal/semiconductor compound regions on said gate electrode and said drain and source regions.

16. The method of claim 1, wherein said doping of the gate electrode is performed on the basis of process parameters selected to restrict dopant penetration of the gate insulation layer.

17. A field effect transistor, comprising:
a substrate having formed thereon a semiconductor region having a top surface;
a drain region formed on said top surface of said semiconductor region and extending along a lateral direction and a height direction;
a source region formed on said top surface of said semiconductor region and extending along said lateral direction and said height direction; and
a gate electrode formed above said top surface of said semiconductor region and extending along said lateral direction and said height direction, said gate electrode laterally located between said drain region and said source region and separated from said top surface of said semiconductor region by a gate insulation layer, said drain and source regions extending along said height direction at least to an upper surface of said gate electrode.

18. The field effect transistor of claim 17, wherein said gate electrode is at least partially comprised of a doped semiconductor material, whereby a peak concentration of dopants in said gate electrode is less than a peak concentration of dopants in said drain and source regions.

19. The field effect transistor of claim 18, wherein said semiconductor region is formed on an insulating layer and has an extension in the height direction in the range of approximately 5-50 nm.

20. A method of forming a field effect transistor, the method comprising:
forming a recess in a semiconductor layer, said recess having a bottom surface;
forming an implantation mask in at least said recess;
forming a drain region and a source region by performing at least one ion implantation process to implant ions into said semiconductor layer adjacent said implantation mask, wherein said implantation mask substantially prevents ions from penetrating said bottom surface of said recess;
removing said implantation mask to expose said bottom surface of said recess;
forming a gate insulation layer on said exposed bottom surface of said recess;
forming a gate electrode on said gate insulation layer; and
doping said gate electrode.

21. The method of claim 20, wherein forming said gate electrode includes depositing a gate electrode material above said gate insulation layer and removing excess material of said gate electrode material to form the gate electrode.

22. The method of claim 20, further comprising, prior to forming said gate insulation layer, forming sidewall spacers on sidewalls of said recess that are exposed by removing said implantation mask.

23. The method of claim 22, wherein a width of said sidewall spacers is controlled on the basis of a target gate length for said gate electrode.

24. The method of claim 20, wherein said implantation mask is removed by an isotropic etch process.

25. The method of claim 20, further comprising forming metal/semiconductor compound regions on said gate electrode and said drain and source regions.

26. The method of claim 20, wherein a lateral dimension of said recess is greater than a target gate length of said gate electrode.

27. The method of claim 20, wherein said recess is formed by anisotropically etching said semiconductor layer.

* * * * *